(12) United States Patent
Smith et al.

(10) Patent No.: US 6,760,232 B2
(45) Date of Patent: Jul. 6, 2004

(54) POWER DISTRIBUTION SYSTEM HAVING A DEDICATED POWER STRUCTURE WITH APERTURES FOR MOUNTING INTEGRATED CIRCUIT PACKAGES

(75) Inventors: Larry D. Smith, San Jose, CA (US); Michael C. Freda, Morgan Hill, CA (US); Ali Hassanzadeh, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/809,838

(22) Filed: Mar. 16, 2001

(65) Prior Publication Data

US 2002/0131256 A1 Sep. 19, 2002

(51) Int. Cl.[7] .............................. H05K 7/02; H05K 7/06; H05K 7/08; H05K 7/10
(52) U.S. Cl. ........................ 361/780; 361/803; 174/260
(58) Field of Search .................................. 361/760–764, 361/780–795, 803; 174/250–262; 257/777–780, 685–686, 712, 724–725, 692, 700; 438/612–613; 439/71–75, 66, 91; 248/289

(56) References Cited

U.S. PATENT DOCUMENTS

| | | | |
|---|---|---|---|
| 5,074,799 A | * 12/1991 | Rowlette, Sr. | 439/178 |
| 5,079,069 A | 1/1992 | Howard et al. | |
| 5,261,153 A | 11/1993 | Lucas | |
| 5,473,510 A | * 12/1995 | Dozier, II | 361/719 |
| 5,481,436 A | 1/1996 | Werther | |
| 5,691,041 A | * 11/1997 | Frankeny et al. | 257/712 |
| 5,694,297 A | * 12/1997 | Smith et al. | 307/150 |
| 5,870,274 A | 2/1999 | Lucas | |
| 5,870,290 A | 2/1999 | Chun et al. | |
| 5,982,635 A | * 11/1999 | Menzies et al. | 257/692 |
| 6,075,285 A | * 6/2000 | Taylor et al. | 257/691 |
| 6,351,393 B1 | * 2/2002 | Kresge et al. | 174/252 |
| 6,639,155 B1 | * 10/2003 | Bupp et al. | 174/260 |

FOREIGN PATENT DOCUMENTS

| | | |
|---|---|---|
| WO | 96/24234 | 8/1996 |
| WO | 99/41812 | 8/1999 |

OTHER PUBLICATIONS

International Search Report, PCT/US 02/08400, mailed Jul. 26, 2002.

* cited by examiner

*Primary Examiner*—Kamand Cuneo
*Assistant Examiner*—Tuan Dinh
(74) *Attorney, Agent, or Firm*—Meyertons Hood Kivlin Kowert & Goetzel, P.C.; B. Noël Kivlin; Erik A. Heter (57) ABSTRACT

A system and method for distributing power to an integrated circuit. In one embodiment, a power laminate may be mounted to a printed circuit board (PCB). The integrated circuit for which power is to be distributed may be electrically coupled to the PCB. The power laminate may include one or more power planes and one or more reference (i.e. ground) planes, with each pair of power/reference planes separated by a dielectric layer. The power laminate may also include a connector or other means for receiving power from an external power source. The power laminate may be electrically coupled to the integrated circuit, thereby enabling it to provide core power to the integrated circuit. The power laminate may also include a voltage regulator circuit, and a plurality of decoupling capacitors. In one embodiment, the power laminate may include a plurality of apertures which allow for the passing of connections between the integrated circuit and the PCB. The integrated circuit may be mounted to the PCB by solder balls of a ball-grid array, elestomeric connections of a land-grid array, or other type of mounting. The each of the solder balls or elastomeric connections may pass though one of the apertures of the power laminate.

16 Claims, 8 Drawing Sheets

POWER DISTRIBUTION SYSTEM HAVING A DEDICATED POWER STRUCTURE WITH APERTURES FOR MOUNTING INTEGRATED CIRCUIT PACKAGES

BACKGROUND OF THE INVENTION

1. Field of the Invention

This invention relates to electronic circuits, and more particularly, to the distribution of power to electronic circuits.

2. Description of the Related Art

With each new generation of computer systems, performance demands increase. One such demand relates to power distribution systems, which are required to supply increasing currents at lower voltages and lower impedances. These demands make design of a power distribution system increasingly difficult.

In many computer systems, processors and application specific integrated circuits (ASICs) are the chief consumers of power. Power is typically delivered to these components through a printed circuit board (PCB). Power distribution to a processor or ASIC can consume a significant portion of PCB resources, and is but one of several competing demands which must be considered during the PCB's design. Other demands include signal distribution and routing, component mounting, connector mounting, and so on. These demands are often times in conflict with one another, and thus compromises must be made to the design of the PCB. Such compromises may result in a less than optimal solution in addressing some or all of these demands.

Power distribution on a PCB typically involves at least one pair of copper planes (a power plane and a ground plane), along with a number of decoupling capacitors, typically mounted on a surface of the PCB. Since the PCB must also accommodate signal traces for a number of signals, the copper planes are often times perforated by holes known as vias. The presence of these signal vias may have a tendency to increase the inductance of the copper planes, which in turn results in an increase in impedance. Inductive impedance can be expressed by the formula $Z=2\pi f L$, wherein Z is the impedance, f is the frequency, and L is the inductance. Thus, the impedance of the power distribution system may be affected in large part by both the number of signal vias, as well as the frequency at which the computer system is designed to operate.

Further compounding problems of power distribution on a PCB is the fact that many computer systems required different voltages for various components. This may increase the number of copper planes needed for power distribution, as each voltage may require a separate power plane, and often times will have a separate ground plane as well. This may further increase the number of vias necessary in the PCB, thereby increasing the inductance of each of the power planes.

SUMMARY OF THE INVENTION

The problems outlined above may be solved in large part by a system and method for distributing power to an integrated circuit. In one embodiment, a power laminate may be mounted to a printed circuit board (PCB). The integrated circuit for which power is to be distributed may be electrically coupled to the PCB. The power laminate may include one or more power planes and one or more reference (i.e. ground) planes, with each pair of power/reference planes separated by a dielectric layer. The power laminate may also include a connector or other means for receiving power from an external power source. The power laminate may be electrically coupled to the integrated circuit, thereby enabling it to provide core power to the integrated circuit. The power laminate may also include a voltage regulator circuit, and a plurality of decoupling capacitors. In one embodiment, the power laminate may include a plurality of apertures which allow for the passing of connections between the integrated circuit and the PCB. The integrated circuit may be mounted to the PCB by solder balls of a ball-grid array, elestomeric connections of a land-grid array, or other type of mounting. The each of the solder balls or elastomeric connections may pass though one of the apertures of the power laminate.

The PCB may include a signal layer for conveying signals to and from the integrated circuit, but does not include any means for directly providing core power to the integrated circuit. Thus, all core power provided to the integrated circuit may be supplied by the power laminate. However, the PCB may include one or more pair of copper planes (e.g. a pair including a power plane and a reference plane) for providing power to other components mounted upon the PCB.

As used herein, the term "core power" refers to that power having a specific voltage and a specific current that is supplied to the integrated circuit itself. For example, one embodiment of an integrated circuit may require a core power having a voltage of 1.2 volts and a maximum current of 20 amperes. The PCB may be configured for providing power to other components mounted upon it. In one embodiment, the integrated circuit may require power at a low voltage, such as 1.2 volts, for high-frequency operation, while other components mounted upon the PCB which operate at a lower frequency may be configured to receive power with a higher voltage, such as 5 volts. One embodiment of the power laminate having a voltage regulator may be configured to receive power from the PCB to which it is mounted, whereupon the voltage regulator may convert this power into the core power required by the integrated circuit. In another embodiment, the power laminate (and thus the voltage regulator, if present) may be configured to receive power from a source separate from the PCB.

In one embodiment, a power laminate may be mounted on the bottom of a PCB, with the integrated circuit mounted on top. The power laminate and the integrated circuit may be attached to the PCB by soldering, and one or both may include an array of solder balls known as a ball-grid array. Alternatively, the power laminate may include a land-grid array, in lieu of a BGA, for mounting it to the PCB.

In another embodiment, the power laminate may be arranged between the integrated circuit and the PCB. The power laminate may have at least one aperture to allow the passage of signals between the PCB and the integrated circuit.

The power laminate may include a voltage regulator circuit. The voltage regulator circuit may be implemented with either discrete components or with a voltage regulator module. In one embodiment, the voltage regulator may be a switching voltage regulator. The switching voltage regulator may include an inductor for translating energy from one voltage to another, and a capacitor to supply current in times of heavy or transient demands by the integrated circuit. A switch coupling the inductor to a reference plane may enable some of the energy to be drained from the inductor when the ability of the voltage regulator to supply current exceeds the current demand of the integrated circuit.

The power laminate may also include a plurality of decoupling capacitors. In one embodiment, the decoupling capacitors may be surface-mounted capacitors. Mounting the decoupling capacitors on the power laminate may save a significant amount of space on the PCB.

Thus, in various embodiments, the system for distributing power to an integrated circuit including a power laminate may provide various advantages. By distributing power to the integrated circuit using a power laminate, a PCB may be optimized for signal distribution and routing, while the power laminate is optimized for core power distribution. Compromises to both core power distribution and signal distribution that occur when both are implemented on the PCB may be avoided. Placing all power distribution functions on the power laminate, including a voltage regulator circuit and decoupling capacitors may result in a significant savings of space on the PCB. Furthermore, distribution of power by a power laminate may result in a power connection with lower inductance than can be achieved by distributing power on the PCB. This low-inductance power connection may result in a significant lowering of impedance in the power distribution system. With a low impedance power connection, power may flow more easily from the power distribution system to the integrated circuit. In addition, sockets for mounting the integrated circuit and/or the power laminate may be eliminated in those embodiments including a plurality of apertures that allow for the passing of connections between the integrated circuit and the PCB.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
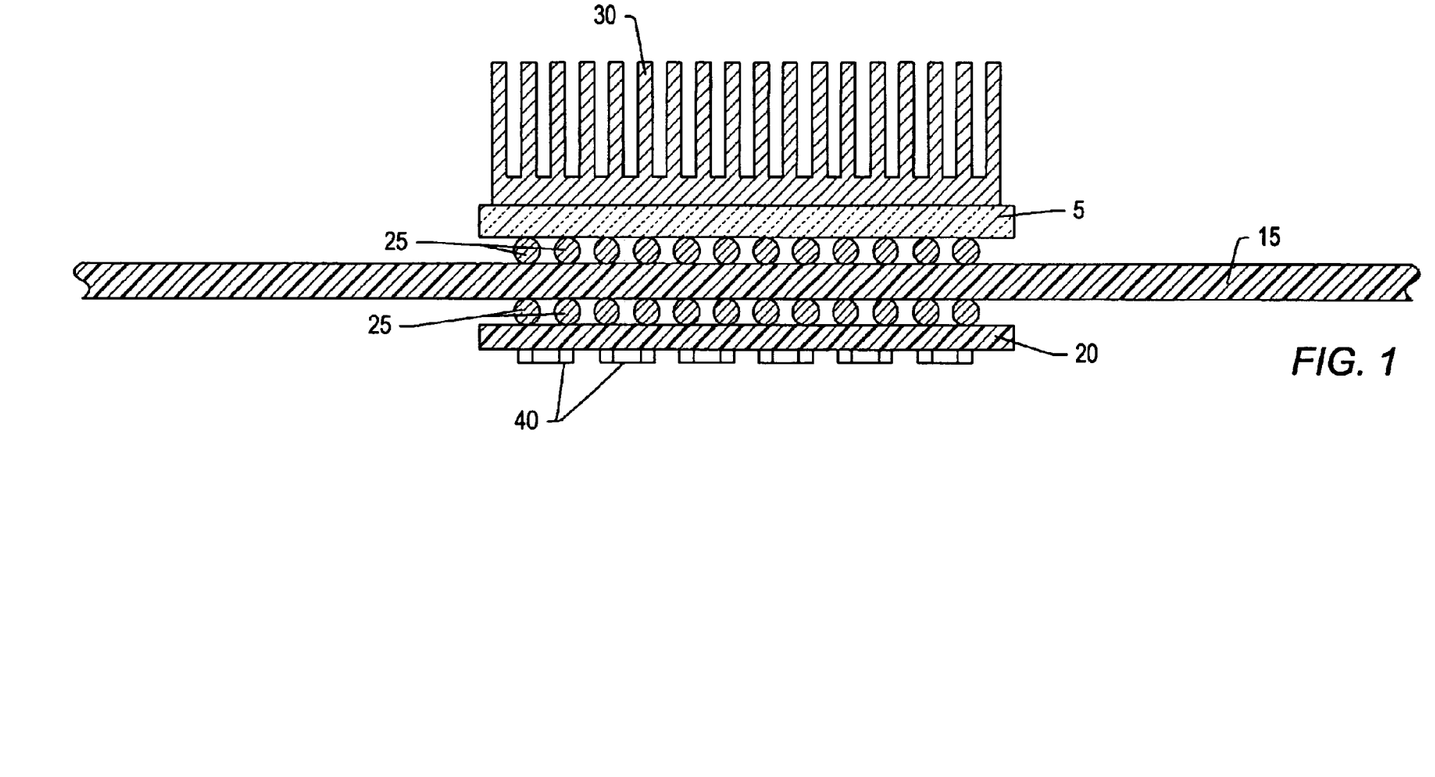
FIG. 1 is a drawing illustrating one embodiment of a power distribution system for an integrated circuit, the power distribution system including a power laminate with decoupling capacitors.

Turning now to FIG. 1, a drawing illustrating one embodiment of a power distribution system, including a power laminate, for an integrated circuit is shown. Integrated circuit 5 is mounted to printed circuit board (PCB) 15 by solder balls 25, which are part of a ball-grid array (BGA). Heat sink 30 may be mounted upon integrated circuit 5 for the purposes of dissipating heat.

Power laminate 20 may be mounted to PCB 15 on the opposite side of integrated circuit 5, also by a BGA. Power laminate 20 may be configured for the distribution of all power to integrated circuit 5. Power laminate 20 may include at least one power plane and one reference (e.g. ground) plane. In the embodiment shown, PCB 15 does not include power or ground planes for providing power to the integrated circuit, and thus is not configured for providing power to the integrated circuit. This may allow PCB 15 to be optimized for signal distribution, while power laminate 20 is optimized for power distribution. PCB 15 may include one or more signal layers, each with a plurality of signal traces, for conveying signals to and from integrated circuit 5.

As used herein, the term "core power" may refer to power having a specific voltage and specific current to be provided to integrated circuit 5, and which may be different from power provided to other components mounted upon PCB 15. For example, integrated circuit 5 may require a core power of 1.2 volts at a maximum of 20 amperes of current, while other components mounted on PCB 15 may require 5-volt power.

A connector or other connecting means for connecting an external power source to power laminate 20 may be present in various embodiments. In various embodiments, the connecting means may be virtually any type of connector that may be mounted to power laminate 20. In another embodiment, power laminate 20 may include pads for soldering wires from an external power source to both the power and reference planes of power laminate 20. The particular means for connecting an external power source to power laminate 20 may be chosen to best suit the particular implementation of the power distribution system. Power may also be delivered to power laminate 20 through PCB 15. In one embodiment, PCB 15 may deliver power at a first voltage, such as 5 volts, to power laminate 20. Power laminate 20 may include a voltage regulator circuit which may then convert the 5-volt power received to the core power required by integrated circuit 5 (e.g. 1.2 volts at 20 amperes). Voltage regulator circuitry for power laminate 20 will be discussed in further detail below.

In the embodiment shown, power laminate 20 includes a plurality of decoupling capacitors 40. In the embodiment shown, decoupling capacitors 40 may be surface mounted capacitors, and may be used to provide additional decoupling capacitance for the power distribution system. In some embodiments, decoupling capacitors may not be required, as power laminate 20 itself may be a significant source of decoupling capacitance. However, if extra decoupling capacitance is necessary, power laminate 20 may be easily configured to allow for the mounting of capacitors.

Figure 2:
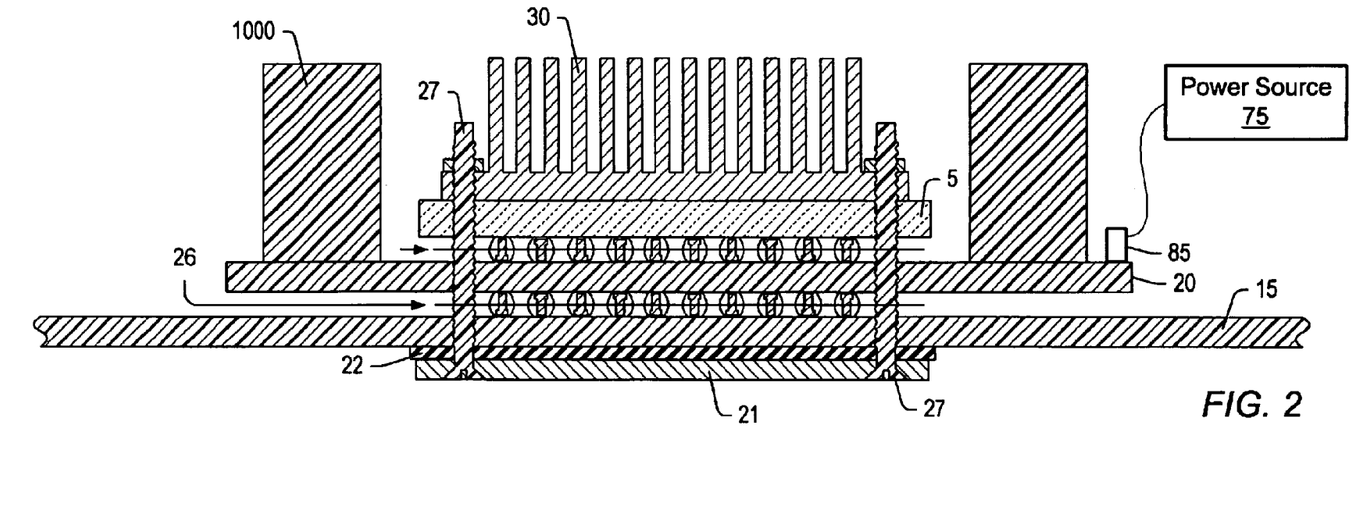
FIG. 2 is an drawing illustrating one embodiment of a power distribution system for an integrated circuit including two voltage regulator modules.

Moving now to FIG. 2, a drawing illustrating an embodiment of a power distribution system, including power laminate 20 with voltage regulator circuit 1000 and bolster plate 21 is shown. In the embodiment shown, both integrated circuit 5 and power laminate 20 are each mounted to PCB 15 by land-grid arrays (LGA) 26. The use of LGA 26 instead of a BGA or other type of solder connection may be useful in embodiments in which a large amount of heat is generated by integrated circuit 5.

In the embodiment shown, bolster plate 21 is mounted directly beneath power laminate 20. Bolster plate 21 may include insulator 22 for electrical and/or electromagnetic isolation from power laminate 20. Fasteners 27 may be used to secure bolster plate 21 to power laminate 20, as well as securing heat sink 30 to integrated circuit 5. Bolster plate 21 may provide protection to the assembly shown during handling (e.g. installing the assembly in a computer system chassis). Bolster plate 20 may provide structural stability to power laminate 20, which, in some embodiments, may be a flexible structure.

In the embodiment shown, voltage regulator circuit 1000 may be implemented in a single package (i.e. a voltage regulator module). Alternate embodiments, wherein a voltage regulator circuit is implemented using discrete components, are possible and contemplated. In some embodiments, power laminate 20 may be a flexible structure, and may therefore include a stiffener for voltage regulator circuit 1000. Voltage regulator circuit 1000 may be configured to receive a first voltage from an external power source (e.g. power source 75, shown here coupled to power laminate 20 via connector 85) and convert it to a second voltage, which may then be supplied to a load such as integrated circuit 5. Additional details for voltage regulator circuit 1000 will be discussed below.

Figure 3:
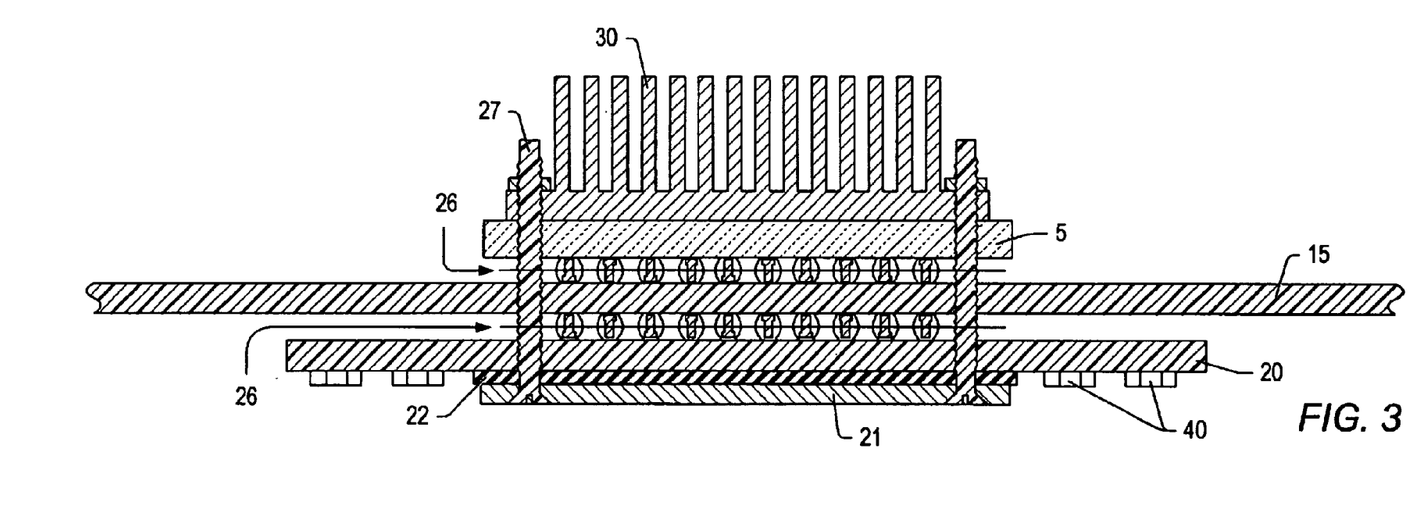
FIG. 3 is drawing illustrating one embodiment of a power distribution system for an integrated circuit, the power distribution system including a power laminate with decoupling capacitors and a bolster plate.

FIG. 3 is a drawing illustrating of one embodiment of a power distribution system for integrated circuit 5, the power distribution system including power laminate 20, decoupling capacitors 40, and bolster plate 21. The embodiment shown may be similar to that illustrated in FIG. 2, with the exception that power laminate 20 is mounted on the opposite side of PCB 15 from integrated circuit 5. Although not explicitly shown here, power laminate 20 may also include a voltage regulator circuit, such as voltage regulator 1000 shown in FIG. 2.

Figure 4:
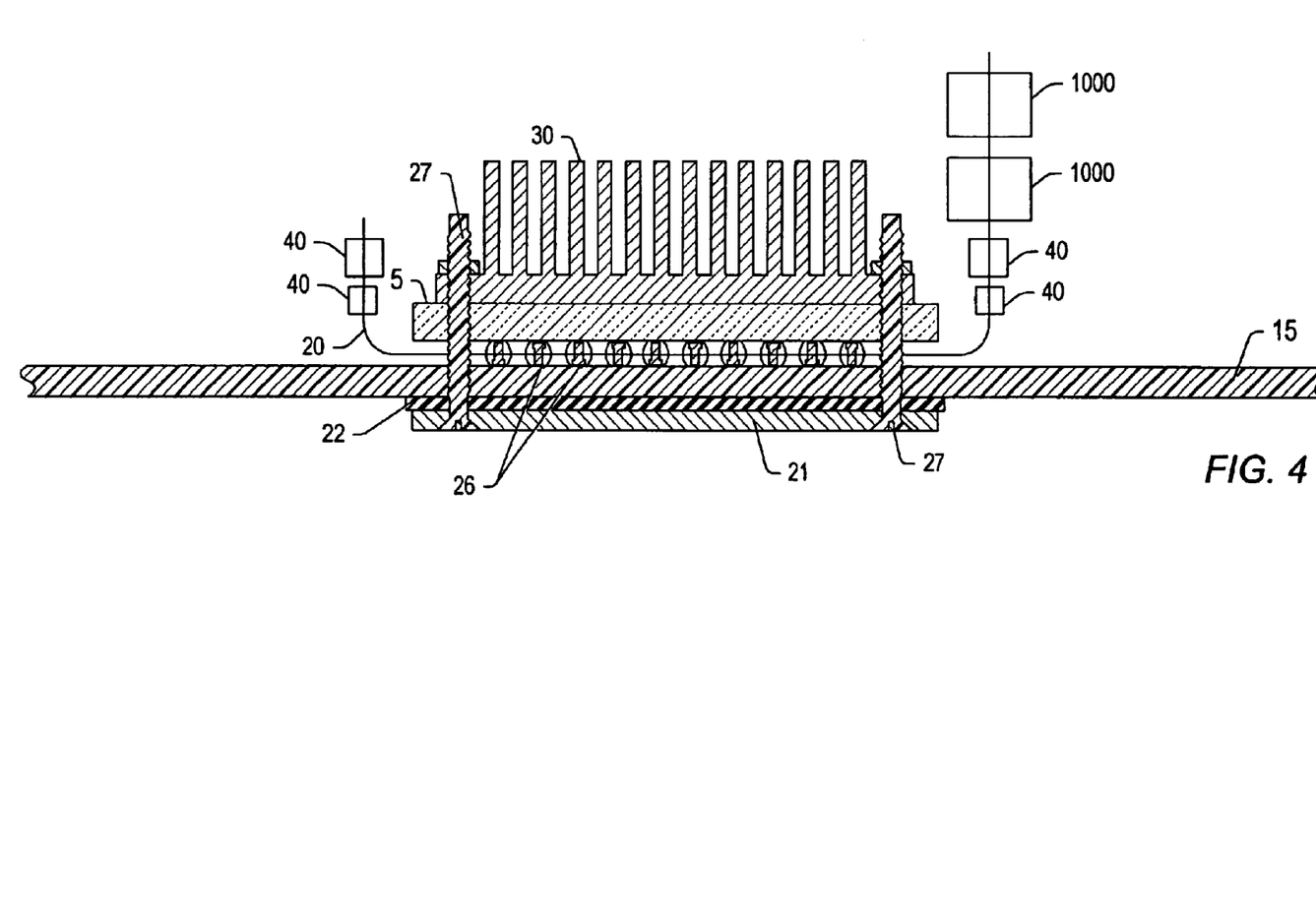
FIG. 4 is a drawing illustrating one embodiment of a power distribution system for an integrated circuit, the power distribution system including a power laminate with apertures for allowing the passing of connections between an integrated circuit and a PCB.

Moving now to FIG. 4, a drawing illustrating one embodiment of a power distribution system for an integrated circuit, the power distribution system including a power laminate with apertures for allowing the passing of connections between an integrated circuit and a PCB. In the embodiment shown, power laminate 20 is arranged between integrated circuit 5 and PCB 15. The embodiment shown of power laminate 20 includes a plurality of apertures which may allow for the passing of elastomeric connections of LGA 26. Other embodiments may mount integrated circuit 5 to PCB 15 using the solder balls of a BGA, wherein each of the solder balls passes through one of the apertures of power laminate 20. In addition to embodiments using an LGA or BGA, other embodiments implementing a different method of mounting integrated circuit 5 to PCB 15 are possible and contemplated.

The embodiment of power laminate 20 shown in FIG. 4 may be made of a flexible material (e.g. kapton cable). Voltage regulator module 1000, which implements a voltage regulator circuit, may be mounted upon power laminate 20. A stiffener may be used in embodiments having voltage regulator module. Additionally, decoupling capacitors 40 may also be mounted upon power laminate 20. Embodiments having other discrete components such as resistors or inductors mounted upon power laminate 20, as may be required to ensure the necessary electrical performance, are possible and contemplated.

Power laminate 20 may be configured to receive power from either PCB 15 or from a power source external to PCB. In one embodiment, power laminate 20 may receive a first voltage from PCB 20, where it is then converted into a second voltage for the core power of integrated circuit 5 by voltage regulator 1000. For example, the PCB may provide 5-volt power to power laminate 20, where the 5-volt power is then converted by voltage regulator 1000 to 1.2 volt core power for integrated circuit 5. In another embodiment, power laminate 20 may receive 5 volt power from a source external to PCB 15, where voltage regulator 1000 may then convert it to the 1.2 volt core power. Power laminate 20 may include a connector for receiving the first voltage. In embodiments where the first voltage is provided by PCB 15, the connector may be a solder ball, elastomeric connection, or other type of electrical connection between power laminate 20 and PCB 15. In embodiments where the first voltage is provided by an external source, the connector may be a mechanical connector, one or more solder pads for attaching wires from the external source, or any other type of connecting means that may provide the first voltage from the external source.

Figure 5:
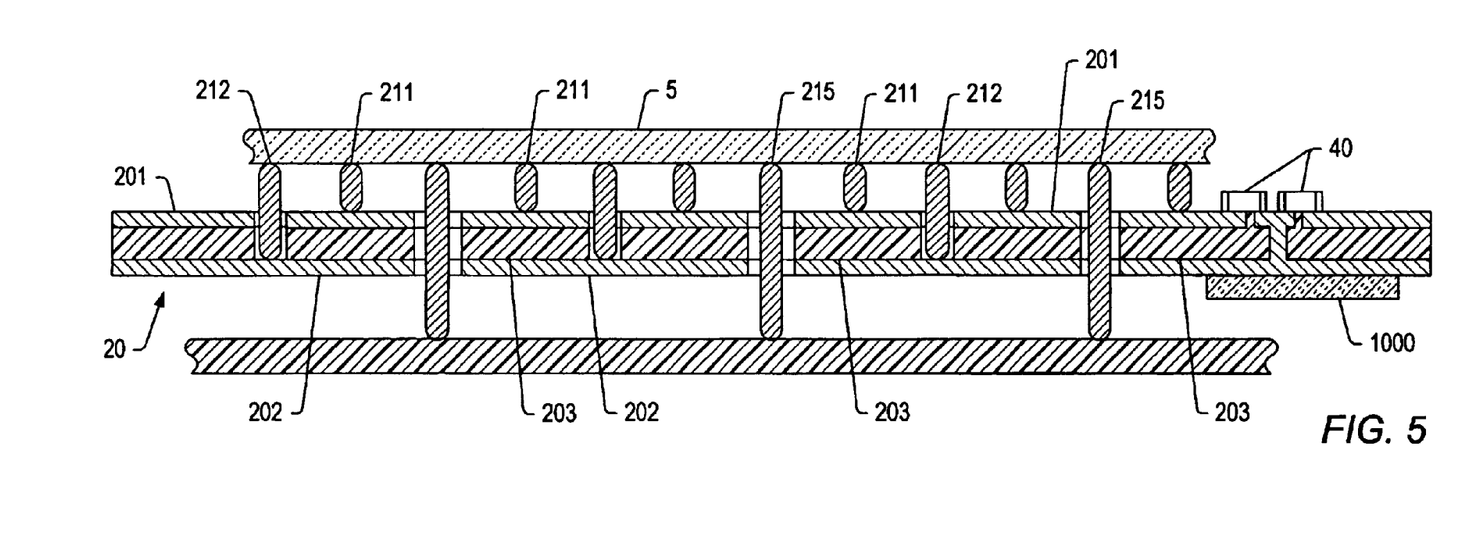
FIG. 5 is a drawing illustrating a cutaway view of a power distribution system including one embodiment of a power laminate, wherein the power laminate is arranged between an integrated circuit and a printed circuit board.

FIG. 5 is a drawing illustrating a cutaway view of a power distribution system including one embodiment of power laminate 20, wherein power laminate 20 is arranged between integrated circuit 5 and a PCB 15. In the embodiment shown, power laminate 20 is shown in a cutaway view, and is arranged between integrated circuit 5 and PCB 15. Power laminate 20 includes a power plane 201 and a reference plane 202, separated by dielectric layer 203. Dielectric layer 203 may be made of any dielectric material, and its thickness may vary according to the needs for the particular implementation. Power plane 201 and reference plane 202 may be constructed of a conductive material, such as copper or other metals with electrically conductive properties.

In the embodiment shown, both power plane 201 and reference plane 202 are include a plurality of apertures to allow signals to pass from integrated circuit 5 to PCB 15. Power plane 201 may include additional apertures to allow for the connection of reference plane 202 to integrated circuit 5. Signal connections 215 may be arranged to allow the passage of signals between integrated circuit 5 and PCB 15. Power connections 211 may connect directly from power plane 201 to integrated circuit 5, thereby providing it with power. Ground connections 212 may connect reference plane 202 to integrated circuit 5, thereby providing a current return path.

Capacitors 40 may also be included in various embodiments of power laminate 20. In the embodiment shown, capacitors 40 are surface-mounted capacitors mounted to one side of power laminate 20. Various types of capacitor packages may be used, and capacitors 40 may be mounted upon either side of the power laminate. Capacitors 40 may be used to provide additional decoupling capacitance (over that provided by the power laminate itself) within the power distribution system. In addition, the embodiment shown here for power laminate 20 may be configured to accommodate a voltage regulator circuit.

Figure 6:
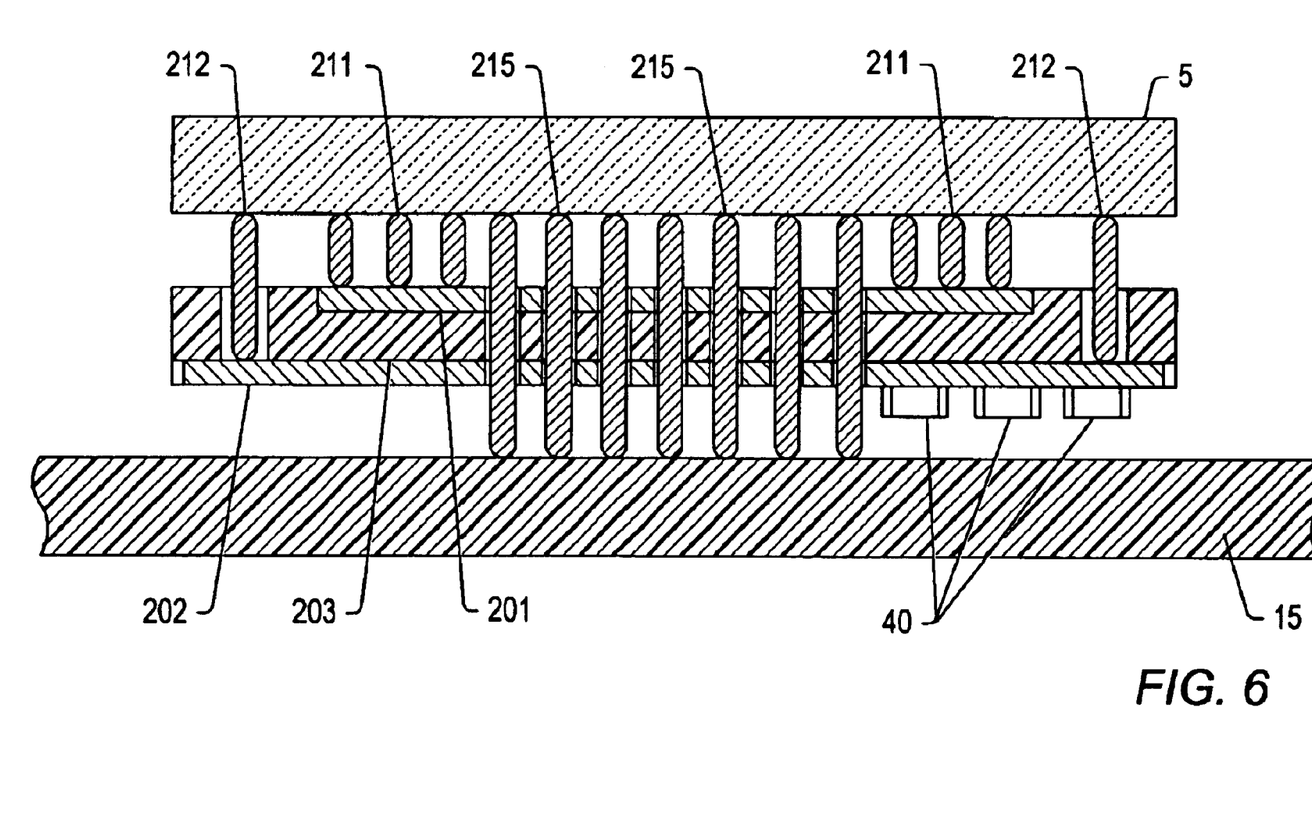
FIG. 6 is a drawing illustrating a cutaway view of a power distribution system including another embodiment of a power laminate, wherein the power laminate is arranged between an integrated circuit and a printed circuit board.

FIG. 6 is a drawing illustrating a cutaway view of a power distribution system including another embodiment of a power laminate, wherein power laminate 20 is arranged between integrated circuit 5 and PCB 15. In the embodiment shown, power laminate 20 includes a large, centrally located aperture in order to allow signals to pass between integrated circuit 5 and PCB 15. The signals may be conveyed between integrated circuit 5 and PCB 15 by signal connections 215, which pass through the aperture in power laminate 20. Power plane 203 may be electrically connected to integrated circuit 5 by power connections 211, thereby providing it with power.

In the embodiment shown, the width of reference plane 202 is slightly larger than the width of power plane 201. In this embodiment, reference plane 202 may be connected to integrated circuit 5 by ground connections 212. Ground connections 212 may be arranged along the periphery of reference plane 202. This may allow reference plane 203 to be coupled to integrated circuit 5 without the need for additional apertures in power plane 201 (although apertures in dielectric layer 203 may be present). Apertures in the planes may give rise to inductance within the planes, which in turn may increase the impedance of the power distribution system. By extending the dimensions of reference plane 202 to allow it to be connected to integrated circuit 5 without the need for more apertures in power plane 201, additional inductance may be avoided. Other embodiments, wherein the arrangement of power plane 201 and reference plane 202 are reversed (i.e. power plane 201 having extended dimension with power connectors 211 arranged on the periphery) are possible and contemplated.

Figure 7:
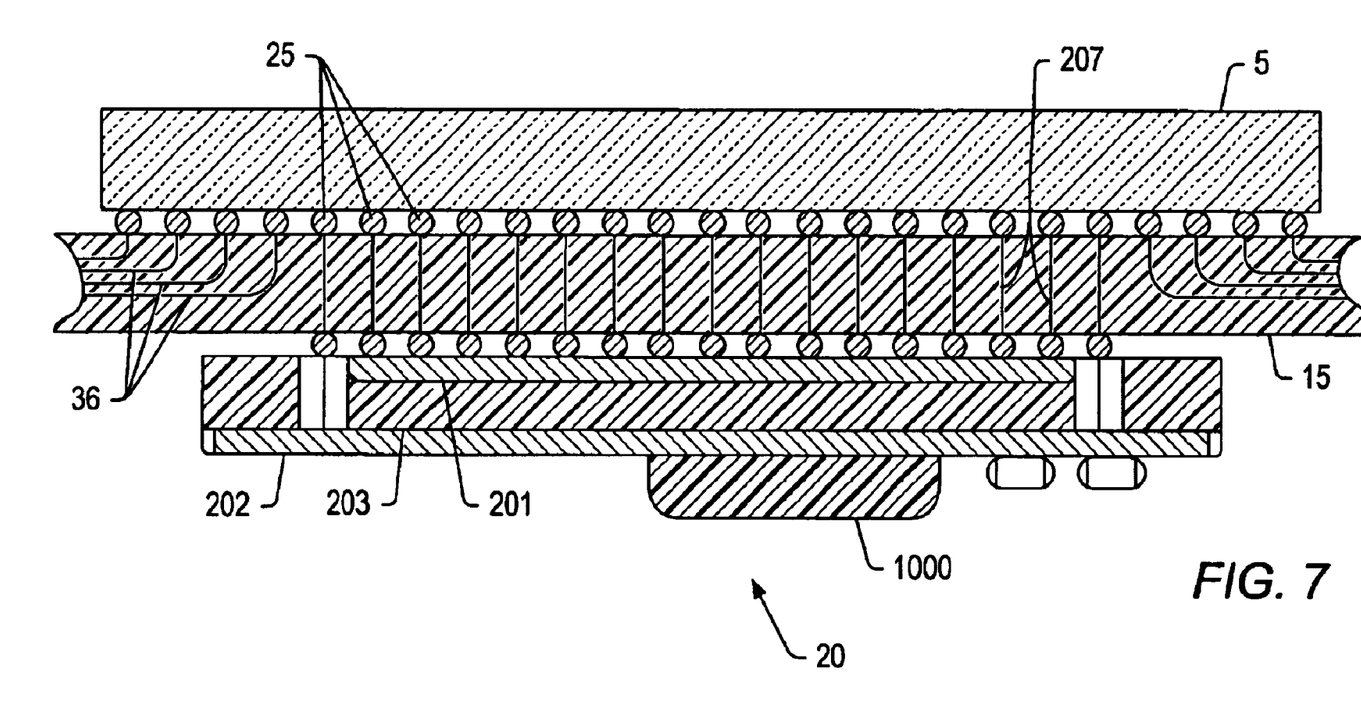
FIG. 7 is a drawing illustrating a cutaway view of a power distribution system including an embodiment of a power laminate mounted to a printed circuit board, with an integrated circuit mounted upon the opposite side of the printed circuit board.

FIG. 7 is a drawing illustrating a cutaway view of a power distribution system including an embodiment of power laminate 20 mounted to a PCB 15, with integrated circuit 5 mounted upon the opposite side of PCB 15. In the embodiment shown, both power laminate 20 and integrated circuit 5 are mounted to PCB 15 by solder balls 25. Solder balls 25 connecting power laminate 20 to PCB 15 may be part of a ball-grid array. Similarly, solder balls 25 connecting integrated circuit 5 to PCB 15 may also be part of a ball-grid array.

Both power plane 201 and reference plane 202 may be connected to integrated circuit 5 by conductors 207, which pass through PCB 15. In one embodiment, conductors 207 are terminated at solder pads configured for accommodating solder balls on both the top and bottom of PCB 15.

In the embodiment shown, power plane 201 may be free of apertures, which may be required in other embodiments to allow for connections for signals and connections to the reference plane. In this embodiment, connections for power plane 201 may be centrally located on power laminate 20 and integrated circuit 5. Reference plane 202 may have a larger width (or length) than power plane 202, and thus, connections to PCB 15 may be arranged closer to the peripheral of power laminate 20 than those connections for power plane 201. This may help in eliminating the need for apertures in power plane 201. The elimination of apertures in power plane 201 and/or reference plane 202 may result in lower inductance (and thus, lower impedance) in the power distribution system.

It should be noted that embodiments wherein the arrangement of power plane 201 and reference plane 202 is the opposite as shown (i.e. reference plane 202 on top and nearer to PCB 15 than power plane 201) are possible and contemplated.

PCB 15 may include a plurality of signal traces 36 connected to for conveying signals to and from integrated circuit 5. These signals may be conveyed from PCB 15 to integrated circuit 5 through LGA 26. Signal connections on integrated circuit 5 may be arranged towards the peripheries of the integrated circuit package. This arrangement of signal connections from integrated circuit 5 to the signal traces 36 on PCB 15 may allow for unobstructed electrical paths (i.e. conductors 207) from both power plane 201 and reference plane 202 to integrated circuit 5. This may in turn allow for greater optimization of PCB 15 for conveying signals, as well as greater optimization of power laminate 20 for power distribution.

The various arrangements of the power laminate (with respect to the PCB and the integrated circuit) shown above each provide certain advantages and disadvantages. Embodiments where the power laminate is arranged between the PCB and integrated circuit may result in a significant savings of circuit board area, as the area on the PCB opposite the integrated is not used for mounting the power laminate. However, such embodiments may require apertures to allow for signals to pass between the integrated circuit and the PCB. This may result in a greater inductance associated with power laminate (as opposed to embodiments wherein there are no apertures in the power and/or reference planes), and thus the impedance of the power distribution system. However, the inductance (and thus impedance) of such an embodiment may be significantly lower than if the power and reference planes are located within the PCB itself.

Figure 8:
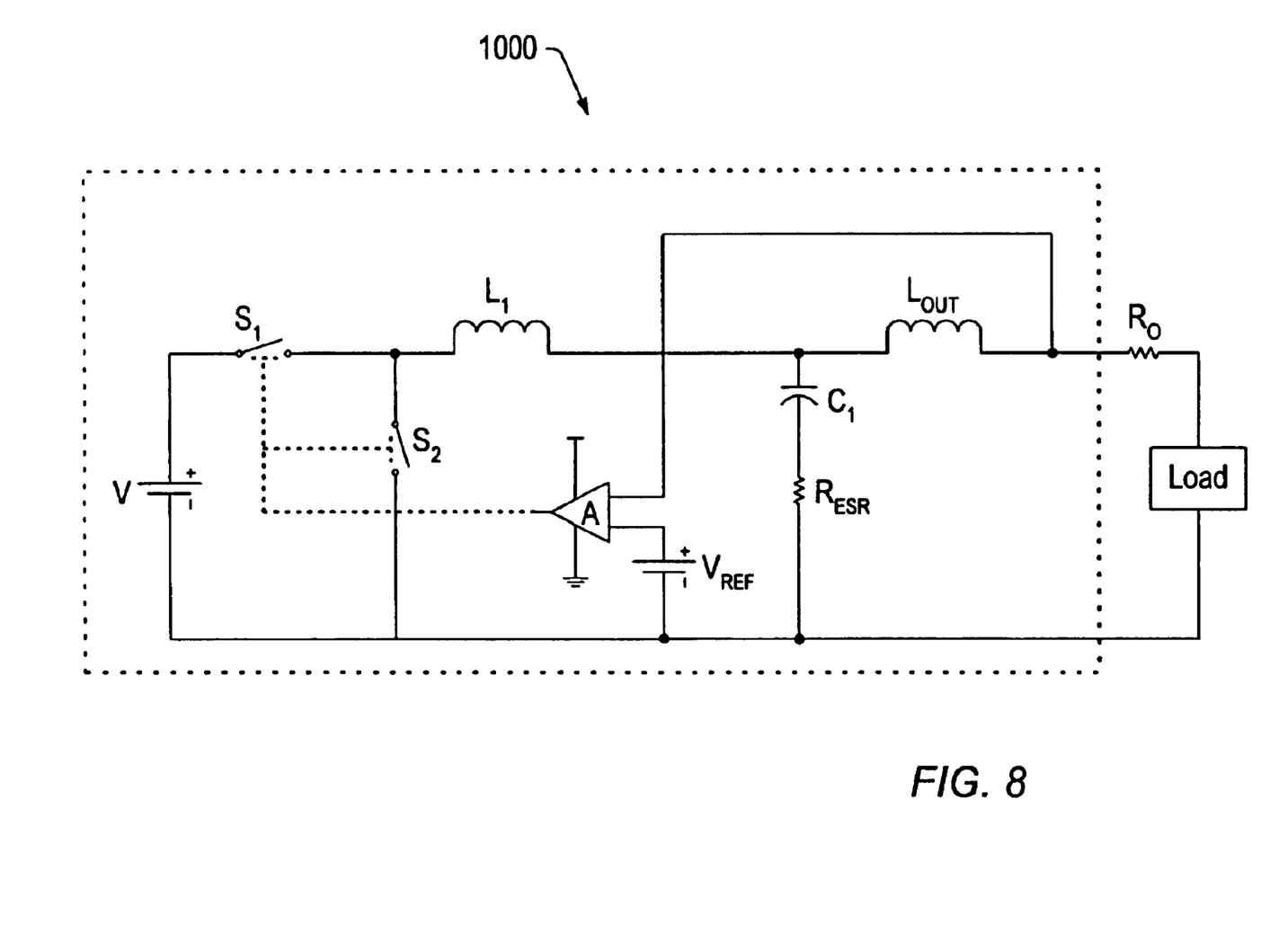
FIG. 8 is a schematic diagram of one embodiment of a voltage regulator circuit that may be included in the power distribution system.

Moving now to FIG. 8, a schematic diagram of one embodiment of a voltage regulator module is shown. Many power distribution systems include voltage regulators, and thus their overall performance and affect on the power distribution system must be factored in to allow optimum selection of decoupling components. A typical voltage regulator may be configured to receive an input voltage from a power source, and provide a second voltage as an output. For example, a voltage regulator circuit might be configured to receive an input voltage of 5 volts, and have an output voltage of 1.8 volts. The voltage regulator may receive the input voltage through a connector. In one embodiment, the connector may comprise one or more solder connections to the PCB, wherein the first voltage is received from the PCB. In another embodiment, the connector may comprise a connector for receiving the input voltage from a source external to the PCB. The voltage regulator may be designed to ensure a smooth and steady voltage is supplied to a load coupled to it. The load may be any type of circuitry previously discussed in this disclosure, as well as other types of circuitry not explicitly discussed herein.

FIG. 8 is a schematic diagram of one embodiment of a voltage regulator which could be used in a power distribution system, such as those discussed above. Voltage regulator circuit 1000, in this embodiment, is a switching voltage regulator. Voltage regulator 1000 includes voltage source V, which is the input voltage to the circuit. Inductor $L_1$ in the circuit has the function of storing energy when switch $S_1$ is closed (and switch $S_2$ is open). By storing energy, inductor $L_1$ may allow current to be delivered to the load. If the current supplied through inductor $L_1$ is more than the current demanded by the load, switch $S_1$ may open, while switch $S_2$ may close. This may allow the excess current to drain through switch $S_2$. When a sufficient amount of current has been drained, switch $S_2$ may open and $S_1$ may close. Inductor $L_1$ may then resume storing energy.

The control of switches $S_1$ and $S_2$ may be performed by amplifier A. Amplifier A may be configured to sense a load voltage with respect to a reference voltage (shown here as $V_{ref}$). If amplifier A senses that load voltage is too high, it may close S2 and open S1, thereby causing inductor $L_1$ to ramp down the current, as described above. If amplifier A senses that load voltage is too low, it may close $S_1$ and open $S_2$, thereby causing inductor $L_1$ to ramp up current. Current from inductor $L_1$ may be integrated by capacitor $C_1$, which may smooth out the voltage across the load. Resistor $R_{ESR}$ is not an actual resistor in the circuit, but rather is shown to represent the equivalent series resistance provided by capacitor $C_1$.

The circuit also includes inductor $L_{out}$, which represents the output inductance seen by the voltage regulator circuit. This inductance may be present in circuit traces of a printed circuit board, wires, pins of a package in which the voltage regulator or the load is contained within, or other type of transmission line. Also shown in the schematic is resistor $R_o$, which represents the resistance provided by the load. As with resistor $R_{ESR}$, neither of these circuit elements are actual components, but are shown to represent quantities that must be taken into account when designing the power distribution system.

An essential parameter for the voltage regulator circuit shown is the amount of time taken to respond to a current transient. For example, suppose the load is a microprocessor which may demand a current of 20 amperes for some period of time. Further, suppose the input voltage to the circuit is 5 volts, the output voltage (i.e. the regulated voltage, or core power voltage supplied to the integrated circuit) is 1.8 volts, and the inductance of L1 is 0.82 $\mu$H. Recall that the voltage across an inductor may be expressed by the equation V=L* (di/dt), wherein V is the voltage, L is the inductance, and di/dt is the rate of change of current with respect to time. Rearranging the equation to solve for time, we have dt=di (L/V). Inserting the values shown above (20 amps, 0.82 $\mu$H, and with V=5 v−1.8 v=3.2 v) into the equation, the response time is 5.13 microseconds. This response time represents a theoretical best-case scenario, whereas in practice, a good estimate may be twice the theoretical best. The response shown here represents rise time of the current. Similarly, the fall time of the current, which may occur when the microprocessor suddenly stops drawing current, may be calculated using the same equation, except in this case the voltage used in the calculation is the output voltage of the voltage regulator circuit (1.8 v). Substituting these values into the equation, a current fall time of 9.11 microseconds is found to be the theoretical best current fall time.

In various embodiments, two main types of inductance may be associated with the power laminate (or power distribution systems in general). Horizontal inductance may be primarily associated with a plane, such as a copper plane used as a power or reference plane. Vertical inductance may primarily be associated with connections to the integrated circuit, or connections from the power laminate to the PCB (e.g. solder balls). Horizontal inductance may be 3–4 times greater than the vertical inductance, and possibly greater when apertures such as signal vias are factored in. By moving power distribution off of a PCB and onto a power laminate, a significant amount of this inductance may be eliminated, resulting in a power distribution system with lower impedance.

Horizontal inductance may be minimized in various ways. Eliminating or minimizing the number of apertures in a power plane (or reference plane) may keep the horizontal inductance at a minimum. In some embodiments where signals must pass through the power laminate, inductance may be minimized by the use of multiple power and/or reference planes. In one embodiment, both the power and reference plane may be divided into multiple pairs of planes, with each pair in an electrically parallel configuration with respect to the other pairs. This may be an effective way to minimize the inductance associated with these types of embodiments. For example, an embodiment with 3 pairs of power/reference planes placed in parallel with each other may have an inductance that is ⅓ of the value of an embodiment using a single power/reference plane pair. Using a very thin dielectric between a power plane and an associated ground plane may also be an effective method of reducing horizontal inductance.

Vertical inductance may be minimized by using more vertical structures in order to mount the power laminate. An example of a vertical structure would be the solder balls of a BGA, as shown in various embodiments above, or the connections associated with an LGA. Since the power laminate is separate from the PCB, and thus must be mounted to it, a large number of vertical structures may be used, thereby minimizing vertical inductance.

By reducing both horizontal and vertical inductance, the overall impedance of a power distribution system for an integrated circuit may be greatly reduced. In one embodiment, a power distribution system including a power laminate may be as low as 10 Pico-henries (pH).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system comprising:
    an integrated circuit;
    a printed circuit board (PCB) including at least one signal layer for conveying signals to the integrated circuit, wherein the PCB excludes any power planes coupled to provide core power to the integrated circuit;
    a power laminate including at least one power plane and at least one reference plane coupled to provide core power to the integrated circuit, wherein the power laminate is separate from the PCB and includes a plurality of apertures for allowing electrical connections to pass between the integrated circuit and the PCB, and wherein the power laminate excludes any signal layers coupled to convey signals to and from the integrated circuit; and
    an external power source, wherein the power laminate receives power from the external power source.

2. The system as recited in claim 1, wherein the integrated circuit is mounted to the PCB by solder balls of a ball-grid array (BGA), wherein each of the solder balls passes through one of the plurality of apertures.

3. The system as recited in claim 1, wherein the integrated circuit is mounted to the PCB by elastomeric connections of a land-grid array (LGA), wherein each of the elastomeric connections passes through one of the plurality of apertures.

4. The system as recited in claim 1, wherein the power laminate includes a voltage regulator circuit, the voltage regulator circuit configured for receiving a first voltage and providing a second voltage to the power laminate, wherein the second voltage is the core power voltage.

5. The system as recited in claim 1 further comprising one or more decoupling capacitors mounted on the power laminate.

6. The system as recited in claim 4, wherein the voltage regulator circuit is configured to receive the first voltage from the PCB.

7. The system as recited in claim 4, wherein the voltage regulator circuit is configured to receive the first voltage from a source external to the PCB.

8. The system as recited in claim 5, wherein the one or more decoupling capacitors are surface mounted capacitors.

9. A method for delivering power to an integrated circuit, the method comprising:

provid­ing an integrated circuit;

providing a printed circuit board (PCB) including at least one signal layer for conveying signals to and from the integrated circuit, wherein the PCB excludes any power planes coupled to provide core power to the integrated circuit;

providing a power laminate separate from the PCB, the power laminate including at least one power plane and at least one reference plane coupled to provide core power to the integrated circuit, wherein the power laminate excludes any signal layers coupled to convey signal to an from the integrated circuit, and wherein the power laminate includes a plurality of apertures for allowing electrical connections to pass between the integrated circuit and the PCB; and providing power to the power laminate from a power source external to the PCB.

10. The method as recited in claim 9 further comprising mounting the integrated circuit to the PCB by solder balls of a ball-grid array (BGA), wherein each of the solder balls passes through one of the plurality of apertures.

11. The method as recited in claim 9 further comprising mounting the integrated circuit to the PCB by elastomeric connections of a land-grid array (LGA), wherein each of the elastomeric connections passes through one of the plurality of apertures.

12. The method as recited in claim 9, wherein the power laminate includes a voltage regulator circuit, the voltage regulator circuit configured for receiving a first voltage and providing a second voltage to the power laminate, wherein the second voltage is the core power voltage.

13. The method as recited in claim 9, wherein one or more decoupling capacitors are mounted upon the power laminate.

14. The method as recited in claim 12, wherein the voltage regulator circuit is configured to receive the first voltage from the PCB.

15. The method as recited in claim 12 wherein the voltage regulator circuit is configured to receive the first voltage from a source external to the PCB.

16. The method as recited in claim 13, wherein the one or more decoupling capacitors are surface mounted capacitors.

* * * * *